(12) United States Patent
Mori

(10) Patent No.: US 7,126,673 B2
(45) Date of Patent: Oct. 24, 2006

(54) ILLUMINATION OPTICAL SYSTEM AND EXPOSURE APPARATUS HAVING THE SAME

(75) Inventor: Kenichiro Mori, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/095,889

(22) Filed: Mar. 31, 2005

(65) Prior Publication Data

US 2005/0219498 A1    Oct. 6, 2005

(30) Foreign Application Priority Data

Apr. 2, 2004    (JP)    ............... 2004-110338

(51) Int. Cl.
 *G03B 27/72*    (2006.01)
 *G03B 27/42*    (2006.01)
(52) U.S. Cl. .............. 355/69; 355/53; 355/71
(58) Field of Classification Search .............. 355/53, 355/67–71; 250/548; 356/399–401
 See application file for complete search history.

(56) References Cited

U.S. PATENT DOCUMENTS

| 5,677,754 | A  | * | 10/1997 | Makinouchi | ................. 355/53 |
| 6,337,734 | B1 | * | 1/2002  | Mori       | ................. 355/69 |
| 6,339,471 | B1 | * | 1/2002  | Morita     | ................. 356/401 |
| 6,573,977 | B1 |   | 6/2003  | Mori       |                          |
| 6,930,758 | B1 | * | 8/2005  | Schuster et al. | ........... 355/67 |

FOREIGN PATENT DOCUMENTS

| JP | 10-303114   | 11/1998 |
| JP | 2000-277413 | 10/2000 |
| JP | 2000-394480 | 10/2000 |

* cited by examiner

*Primary Examiner*—Henry Hung Nguyen
(74) *Attorney, Agent, or Firm*—Morgan & Finnegan LLP

(57) ABSTRACT

An illumination optical system for illuminating a target surface using light from a light source, includes a sensor for detecting a light intensity of the light, a light splitter for splitting part of the light, and an optical element, arranged between the light source and the light splitter, for transmitting the light, and for reflecting the part of the light that has been split by the light splitter, towards the sensor.

22 Claims, 9 Drawing Sheets

PRIOR ART

ILLUMINATION OPTICAL SYSTEM AND EXPOSURE APPARATUS HAVING THE SAME

BACKGROUND OF THE INVENTION

The present invention relates generally to an illumination apparatus, and more particularly to an illumination apparatus that illuminates a patterned mask (or a reticle) in an exposure apparatus in a lithography process used to manufacture a semiconductor device, a liquid crystal device, an image-pickup device (such as a CCD), a thin film magnetic head, etc. The present invention is suitable, for example, for an illumination apparatus that illuminates a reticle at a predetermined polarization state in an exposure apparatus having a projection optical system having such a high numerical aperture ("NA") as 0.9 or higher.

A projection exposure apparatus is employed and uses a projection optical system to project a circuit pattern of a reticle onto a wafer, etc. to transfer the circuit pattern, in manufacturing such a fine semiconductor device as a semiconductor memory and a logic circuit in the photolithography technology.

The minimum critical dimension ("CD") transferable by the projection exposure apparatus or resolution is proportionate to a wavelength of light used for exposure, and inversely proportionate to the NA of the projection optical system. The shorter the wavelength is, the better the resolution is.

A demand for finer semiconductor devices promote use of a shorter wavelength of the exposure light and the higher NA of the projection optical system. Recently, the exposure light source has shifted from the ultra-high pressure mercury lamps (g-line with a wavelength of approximately 436 nm and i-line with a wavelength of approximately 365 nm) to those having shorter wavelengths, such as a KrF excimer laser (with a wavelength of approximately 248 nm) and an ArF excimer laser (with a wavelength of approximately 193 nm). A practical use of $F_2$ laser (with a wavelength of approximately 157 nm) is also advanced. On the other hand, for a higher NA of the projection optical system, a projection optical system having the NA of about 0.6 is dominant in the 1990s, but the development of a projection optical system having a NA higher than 0.9 is now expected. The immersion exposure technology that immerges at least part of the projection optical system and the wafer with a higher refractive index material (liquid, such as a water) than the air provides a projection optical system with a NA of 1.0 or higher. See, for example, Japanese Patent Application, Publication No. 10-303114.

It is necessary for the projection exposure apparatus to control the exposure dose used to expose a pattern to a predetermined one suitable for the resist or a photosensitive material, or to monitor and control the exposure dose during exposure to the wafer. Thus, the projection optical system splits the exposure light using a half mirror, and monitors the exposure dose during the exposure using a exposure dose sensor. See, for example, Japanese Patent Applications, Publication Nos. 2000-294480 and 2000-277413.

Problematically, the p-polarized light lowers the contrast of the interference fringe in the resist applied to the wafer, as a NA of the projection optical system increases. This is because the resist exposes due to the light intensity of the electric field component of the light: The electric field vector of the p-polarized light does not generate an interference fringe, but provides a uniform light intensity distribution irrespective of locations.

FIG. 7 is a view showing that the contrast of the interference fringe (or image) reduces in a high-NA projection optical system. The XYZ coordinate is set as shown in FIG. 7, and diffracted lights $E_+$ and $E_-$ interfere with each other and form the interference fringe. Each diffracted light contains s-polarized light Es having an electric field vector parallel to a substrate PL, and p-polarized light Ep orthogonal to the s-polarized light Es. The diffracted lights $E_+$ and $E_-$ are expressed by the following Equations 1 and 2, where ν is a frequency and λ is a wavelength. However, for simple description purposes, the s-polarized and p-polarized lights have the same phase or are linearly polarized lights in the 45° direction.

$$E_+ = \begin{pmatrix} -Ep \cos\theta \\ Es \\ -Ep \sin\theta \end{pmatrix} e^{2\pi i \left(vt - \frac{z\cos\theta}{\lambda} + \frac{x\sin\theta}{\lambda}\right)} \quad \text{[EQUATION 1]}$$

$$E_- = \begin{pmatrix} -Ep \cos\theta \\ Es \\ -Ep \sin\theta \end{pmatrix} e^{2\pi i \left(vt - \frac{z\cos\theta}{\lambda} - \frac{x\sin\theta}{\lambda}\right)} \quad \text{[EQUATION 2]}$$

A sum of these vectors is a wave front of the interference fringe, and given by the following Equation 3:

$$E_+ + E_- = \begin{pmatrix} -2Ep\cos\theta\cos\left(2\pi\frac{x\sin\theta}{\lambda}\right) \\ 2Es\cos\left(2\pi\frac{x\sin\theta}{\lambda}\right) \\ -2iEp\sin\theta\sin\left(2\pi\frac{x\sin\theta}{\lambda}\right) \end{pmatrix} e^{2\pi i \left(vt - \frac{z\cos\theta}{\lambda}\right)} \quad \text{[EQUATION 3]}$$

A square of an absolute value of this wave front (Equation 3) is the light intensity of the interference fringe, and given by the following Equation 4:

$$|E_+ + E_-|^2 = 4Ep^2\cos^2\theta\cos^2\left(2\pi\frac{x\sin\theta}{\lambda}\right) + \quad \text{[EQUATION 4]}$$
$$4Es^2\cos^2\left(2\pi\frac{x\sin\theta}{\lambda}\right) +$$
$$4Ep^2\sin^2\theta\sin^2\left(2\pi\frac{x\sin\theta}{\lambda}\right)$$
$$= 4(Es^2 + Ep^2\cos 2\theta)\cos^2\left(2\pi\frac{x\sin\theta}{\lambda}\right) +$$
$$4Ep^2\sin^2\theta$$

A coefficient $$\cos^2\left(2\pi\frac{x\sin\theta}{\lambda}\right)$$

in Equation 4 corresponds to the interference fringe, and provides a light intensity distribution of the line and space ("L & S") in the x direction. When a fine pattern is projected by the projection lens or optical system having a high NA, an angle θ between diffracted lights increases. For example, FIG. 8 shows the angle θ between diffracted lights in the resist (with a refractive index of 1.7) when the L & S having a period L nm is projected with a wavelength of 193 nm of the ArF excimer laser. Referring to FIG. 8, the angle θ between diffracted lights is 45° for a binary mask when the period of the L & S becomes smaller than 160 nm, and for a Levenson phase shift mask ("PHM") (or alternating-PSM) when the period of the L & S becomes smaller than 80 nm.

When the angle θ between diffracted lights becomes 45°, a term of cos2θ becomes 0 and the p-polarized light does not contribute to the amplitude of the interference fringe, lowering the contrast of the interference fringe of $\sin^2\theta$. The p-polarized and s-polarized lights are defined by a relationship between the diffracted light and the substrate PL. While the above description refers to the p-polarized and s-polarized lights for a pattern that extends in the x direction ("x pattern"), the diffracted light occurs in the y direction for a pattern that extends in the y direction ("y pattern) so that the s-polarized light has an electric field vector in the x-axis direction and the p-polarized light is orthogonal to the s-polarized light. In other words, the s-polarized light for the x pattern corresponds to the p-polarized light for the y pattern. Notably, the polarization state varies according to a base surface and a light incident direction.

Thus, the p-polarized light lowers the image contrast in an exposure apparatus having a high-NA projection optical system. In order to obtain a high-contrast image, it is necessary to reduce the p-polarized light and use the polarization controlled light, i.e., the s-polarized light for exposure.

One problem for exposure with the polarization controlled light is that a half mirror that splits the exposure light has different transmittances between the p-polarized and s-polarized lights. Even when an illumination optical system forms desirably polarized light, the polarization state of the light that transmitted through the half mirror cannot become a desired state, deteriorating the resolution.

FIG. 9 shows transmittances of the s-polarized and p-polarized lights through a non-coated surface (a surface that has no antireflection coating). A conventional exposure apparatus reflects the exposure light on a half mirror and directs the reflected light to an exposure dose sensor, while inclining the half mirror by about 40° to the optical axis so that the exposure dose sensor does not shield the exposure light. For example, the exposure light generally has an angular distribution between about ±30°, and an angle incident upon the half mirror ranges between +10° and +70°. Referring to FIG. 9, the light incident upon the half mirror at the angle of +10° has a transmittance of about 95% for both the p-polarized and s-polarized lights, whereas the light incident upon the half mirror at the angle of +70° has a transmittances of 96% for the p-polarized light and a transmittance of 68% for the s-polarized light. When the s-polarized light is used for exposure, the light intensity differs as large as 27% according to angles incident upon the half mirror. The angularly dependent light intensity difference is as influential as the coma to the projection lens, and deteriorates the resolution.

In exposing a pattern that blends the x and y patterns, suppose that the s-polarized light to the y pattern is the s-polarized light for the half mirror surface and the s-polarized light to the x pattern is the p-polarized light for the half mirror surface. As a result, the light intensity that contributes to imaging in the x direction is greater than the light intensity that contributes to imaging in the y direction. This causes a contrast difference between the x and y patterns, and a HV difference or a difference of the resolved CD between the x and y patterns. This error problematically causes inaccurate pattern transfers.

BRIEF SUMMRY OF THE INVENTION

The present invention is directed to an illumination optical system that provides an illumination at a predetermined polarization state by reducing a transmittance difference caused by an angle and polarization state of the light incident upon the half mirror that is arranged on the optical path.

An illumination optical system according to one aspect of the present invention for illuminating a target surface using light from a light source includes a sensor for detecting a light intensity of the light, a light splitter for splitting part of the light, and an optical element, arranged between the light source and the light splitter, for transmitting the light and for reflecting the part of the light that has been split by the light splitter, towards the sensor.

An illumination optical system according to another aspect of the present invention for illuminating a target surface using light from a light source includes a light splitter for splitting part of the light, and an optical element arranged between the light source and the light splitter, the optical element having a reflective surface that has a reflectance of 2% or higher and reflects the part of the light that has been split by the light splitter, towards the sensor.

An exposure apparatus according to another aspect of the present invention includes the above illumination optical system for illuminating a reticle, and a projection optical system for projecting light that has transmitted the reticle onto an object.

An exposure apparatus according to another aspect of the present invention includes a projection optical system for projecting light from a light source that passes a pattern onto an object to be exposed, a light splitter arranged between the light source and the pattern, the light splitter splitting part of the light that reaches the object, a sensor for detecting the part of the light that is split by the light splitter, and for monitoring an exposure dose on the object, and an optical element arranged between the light source and the light splitter, the optical element reflecting part of the light that has been split by the light splitter, towards the sensor.

A device manufacturing method according to another aspect of the present invention includes the steps of exposing an object using the above exposure apparatus, and developing the object that has been exposed.

Other objects and further features of the present invention will become readily apparent from the following description of the preferred embodiments with reference to the accompanying drawings.

DETAILED DESCRIPTION OF THE PREFERRED EMBODIMENTS

Figure 1:
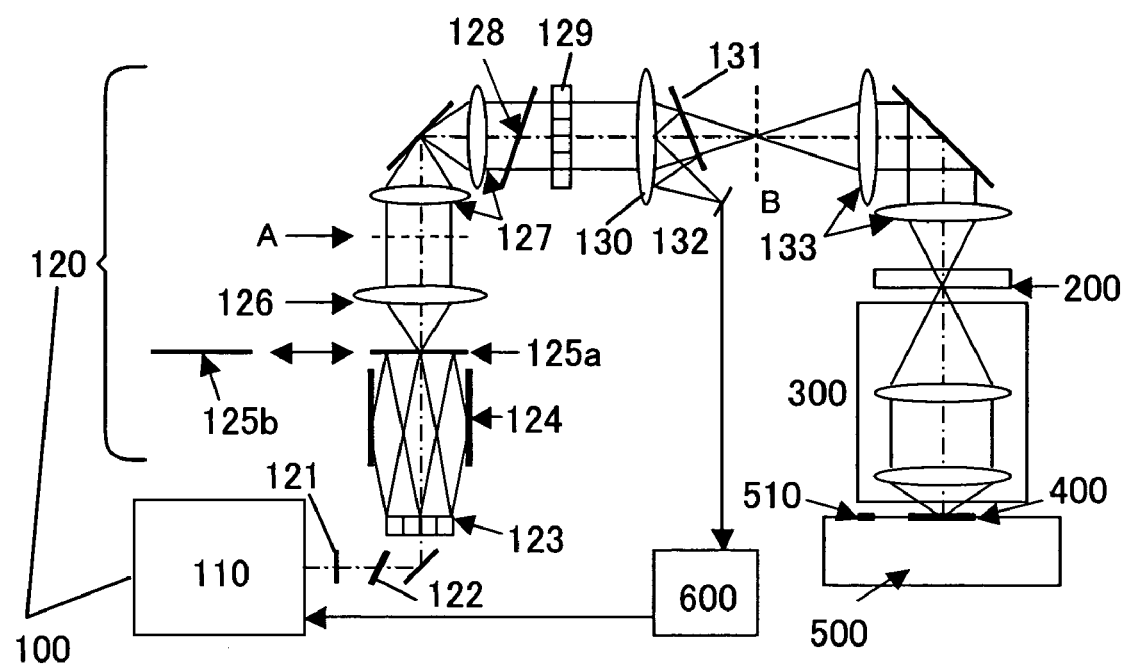
FIG. 1 is a schematic sectional view of a structure of an inventive exposure apparatus.

A description will now be given of an exposure apparatus 1 as one aspect of the present invention, with reference to the accompanying drawings. In each figure, the same reference numeral denotes the same element. Therefore, duplicate descriptions will be omitted. FIG. 1 is schematic sectional view of a structure of the inventive exposure apparatus 1.

The exposure apparatus 1 is a projection exposure apparatus that exposes a circuit pattern of a reticle 200 onto an object 400, e.g., in a step-and-repeat or a step-and-scan manner.

Such an exposure apparatus is suitably applicable to a submicron or quarter-micron lithography process, and a description will be given below of this embodiment taking a step-and-scan exposure apparatus (which is also called "a scanner") as an example. The step-and-scan manner, as used herein, is an exposure method that exposes a mask pattern onto a wafer by continuously scanning the wafer relative to the mask, and by moving, after a shot of exposure, the wafer stepwise to the next exposure area to be shot. The step-and-repeat manner is another mode of exposure method that moves a wafer stepwise to an exposure area for the next shot every shot of cell projection onto the wafer.

The exposure apparatus 1, as shown in FIG. 1, includes an illumination apparatus 100, a reticle stage (not shown) mounted with the reticle 200, a projection optical system 300, a wafer stage 500 mounted with an object to be exposed 400, and a controller 600.

The illumination apparatus 100 illuminates the reticle 200 that has a circuit pattern to be transferred, and includes a light source unit 110 and an illumination optical system 120.

The light source unit 110 uses as a light source, for example, an ArF excimer laser with a wavelength of approximately 193 nm, a KrF excimer laser with a wavelength of approximately 248 nm, but the a type of laser is not limited to excimer laser and, for example, a $F_2$ laser with a wavelength of approximately 157 nm and an extremely ultraviolet light having a wavelength of 20 nm may be used. Similarly, the number of laser units is not limited. For example, two independently acting solid lasers would cause no coherence between these solid lasers and significantly reduces speckles resulting from the coherence. An optical system for reducing speckles may swing linearly or rotationally. A light source applicable to the light source unit 110 is not limited to a laser, and may use one or more lamps such as a mercury lamp and a xenon lamp.

The illumination optical system 120 is an optical system that illuminates a target surface, such as a reticle 200 having a desired pattern, using the light emitted from the light source unit 110. The illumination optical system 120 in this embodiment includes a random phase plate 121, an attenuating or ND filter 122, a micro lens array ("MLA") 123, an internal surface reflector 124, optical elements 125a and 125b, a condenser lens 126, a zoom relay optical system 127, a polarized light splitting film 128, a fly-eye lens 129, a condenser lens 130, a half mirror 131, a sensor 132, and a relay optical system 133.

The random phase plate 121 turns the approximately linearly polarized light emitted from the light source unit 110 into the random polarized light. The ND filter 122 serves to adjust the light intensity of the target surface, and multistage ND filters are arranged switchably.

The MLA 123 includes plural lens elements that are arranged in an array, and integrated with a substrate. The MLA 123 forms a plurality of secondary light sources using the light emitted from the light source unit 110. The MLA 123 may be micro cylindrical lens array. The laser (or light source unit) and an exposure unit may be placed separately, for example, at different floors. Floor vibrations occur asynchronously and independently between the light source unit and the exposure unit, always causing an axial offset and inclination between these units. The MLA 123 serves as a field type of a fly-eye lens, and emits the light of a predetermined angular distribution around the optical axis of the MLA 123, even when the optical axis of the light incident upon the MLA 123 inclines. Thereby, even with the axial inclinations due to the floor vibrations, the exposure unit is supplied with the light having a constant angular distribution.

The internal surface reflector 124 reflects the light emitted from the MLA 123, and generates the light having an approximately uniform distribution on an exit surface of the internal surface reflector 124. The light having a uniform distribution, exited from the internal surface reflector 124, maintains the uniformity, even when an optical path offsets between the light source unit and the exposure unit.

A combination between the MLA 123 and the internal surface reflector 124 provides the light with a uniform and constant angular distribution relative to the optical axis of the exposure unit, on the exit surface of the internal surface reflector 124, even when an optical axis offsets and inclines between the light source unit and the exposure unit.

The optical elements 125a and 125b are diffraction optics, such as a computer generated hologram ("CGH") and refractive optical elements such as a MLA. The optical elements 125a and 125b arrange plural CGHs and/or plural MLAs switchably. The MLA uses a field type hexagonal micro lenses (hexagonal MLA), or disc-shaped micro lenses (circular MLA). The CGH can generate an effective light source having an arbitrary shape, such as an annular shape, a quadrupole shape, and a dipole shape. The optical elements 125a and 125b serve as effective light source generating means that determine the effective light source shape on the pupil surface.

The condenser lens 126 forms a Fourier transformation image of the CGH or MLA on a position A. The condenser lens 126 forms a hexagonal light intensity distribution at the position A when the optical elements 125a and 125b are the hexagonal MLAs, and an approximately circular light intensity distribution at the position A when the optical elements 125a and 125b are the circular MLAs.

The zoom relay optical system 127 projects a light intensity distribution formed at the position A onto an incident surface of the fly-eye lens 129.

The polarized light splitting film 128 is removably arranged on and inclined to the optical path. The polarized light splitting film 128 is coated on a plane-parallel plate. The polarized light splitting film 128 generally transmits the p-polarized light and reflects the s-polarized light for the plane-parallel plate. The plane-parallel plate that is coated with the polarized light splitting film 128 and inclines in the x direction and the plane-parallel plate that is coated with the polarized light splitting film 128 and inclines in the y direction are removably inserted or adapted to change the inclination direction. This configuration realizes a polarization illumination suitable for a x repetitive pattern and a polarization illumination suitable for a y repetitive pattern. In other words, the polarized light splitting film 128 serves as a polarization control means for controlling the polarization state of the incident light to a predetermined polarization state. Thus, the optical elements 125*a* and 125*b* and the polarized light splitting film 128 can provide an illumination having an effective light source and polarization state suitable for the pattern of the reticle 200.

Figure 2:
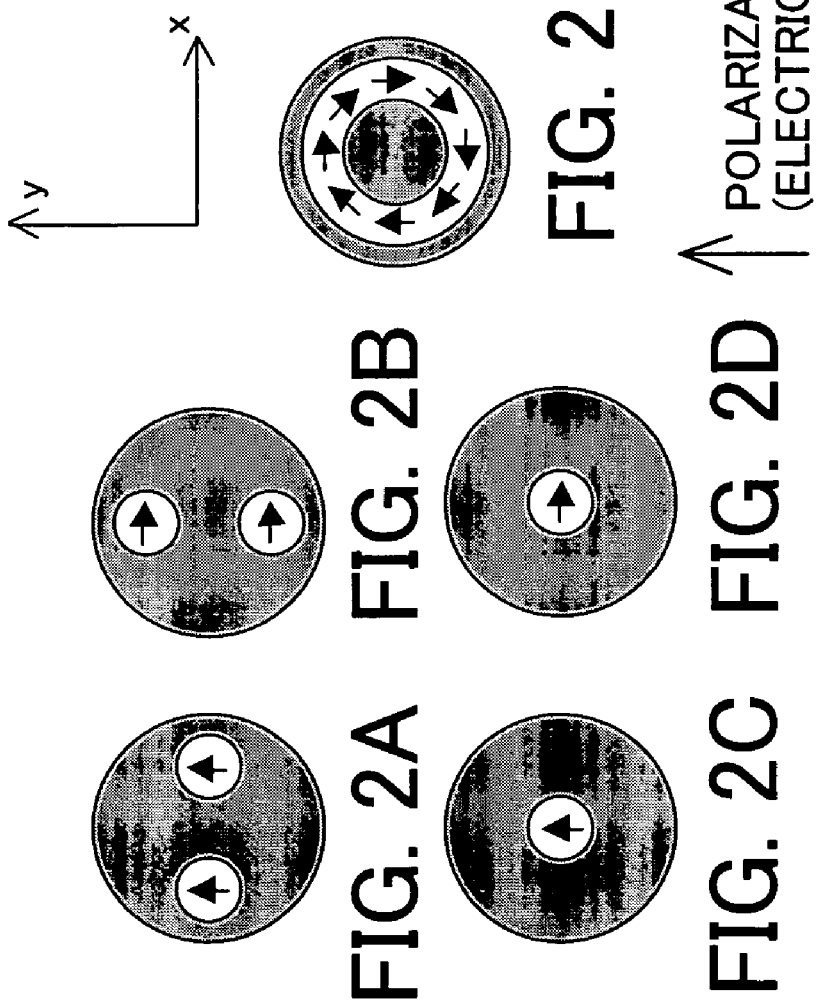
FIG. 2 is a schematic plane view showing a relationship between an effective light source shape and a polarization state on a pupil surface in an illumination optical system shown in FIG. 1.

The effective light source and polarization state realized on the pupil surface by the optical elements 125*a* and 125*b* and the polarized light splitting film 128 include a polarization illumination suitable for a binary mask having a repetitive pattern in the x direction using the s-polarized light having a dipole effective light source shown in FIG. 2A, a polarization illumination suitable for a binary mask having a repetitive pattern in the y direction using the s-polarized light having a dipole effective light source shown in FIG. 2B, a polarization illumination suitable for a Levenson PSM having a repetitive pattern in the x direction using the s-polarized light having a small a effective light source shown in FIG. 2C, a polarization illumination suitable for a Levenson PSM having a repetitive pattern in the y direction using the s-polarized light having a small a effective light source shown in FIG. 2D, and a tangential polarization illumination suitable for a repetitive pattern in the x and y direction using the tangentially polarized light having an annular effective light source shown in FIG. 2E. The present invention does not limit the effective light source shape and the polarization state to those shown in FIGS. 2A to 2E, and may combine various effective light source shapes and polarization states. Here, FIGS. 2A to 2E are schematic plane views showing a relationship between the effective light source shape and the polarization state on the pupil surface of the illumination optical system 120.

This embodiment forms a random polarization state prior to the polarized light splitting film 128, and thus does not have to control the polarization state prior to the polarized light splitting film 128 or consider differences in reflectance and transmittance due to the glass material's birefringence and film's polarization state.

The fly-eye lens 129 forms plural secondary light sources at a pupil position of the illumination optical system 120. The fly-eye lens 129 may be replaced with a MLA and a micro cylindrical lens array.

The condenser lens 130 forms an approximately uniform light intensity distribution by superimposing the light from the secondary light source formed by the fly-eye lens 129, at a position B where a variable stop (not shown) is arranged for controlling an illumination area of the target surface. The condenser lens 130 also serves to reflect part of the light reflected by the half mirror 131, towards the sensor 132 as described later.

The half mirror 131 splits or reflects the part of the exposure light emitted from the light source unit 110. This embodiment arranges the half mirror 131 perpendicular to the optical axis, reduces the transmittance difference caused by the light polarization state, and illuminates the reticle 200 in the desired polarization state.

Figure 3:
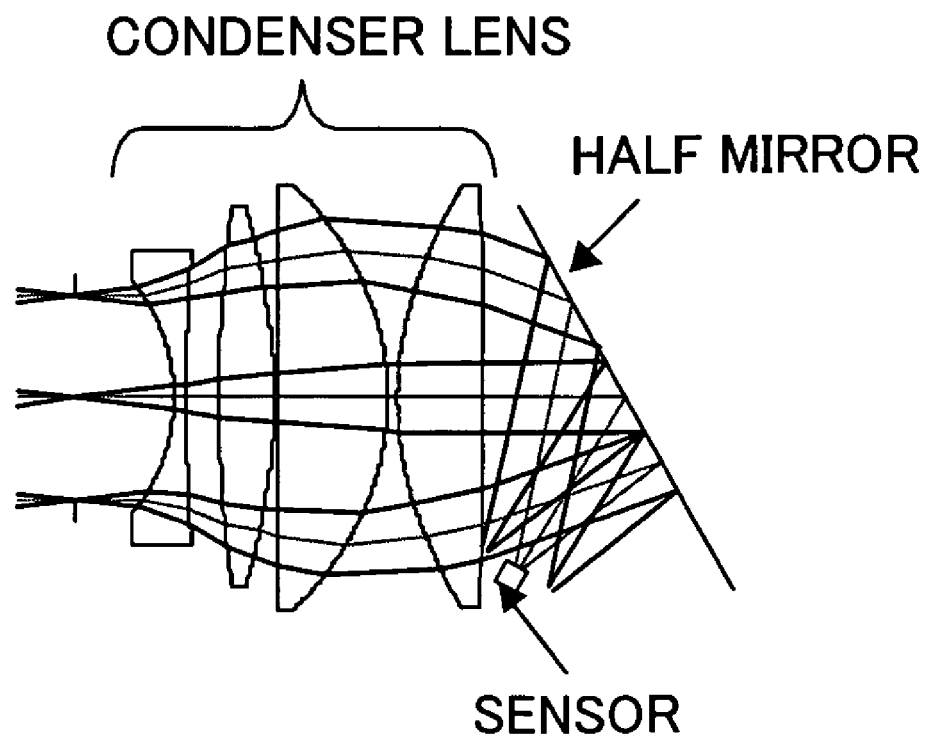
FIG. 3 is an enlarged sectional view showing a positional relationship among a condenser lens, a half mirror, and a sensor in a conventional exposure apparatus.
Figure 4:
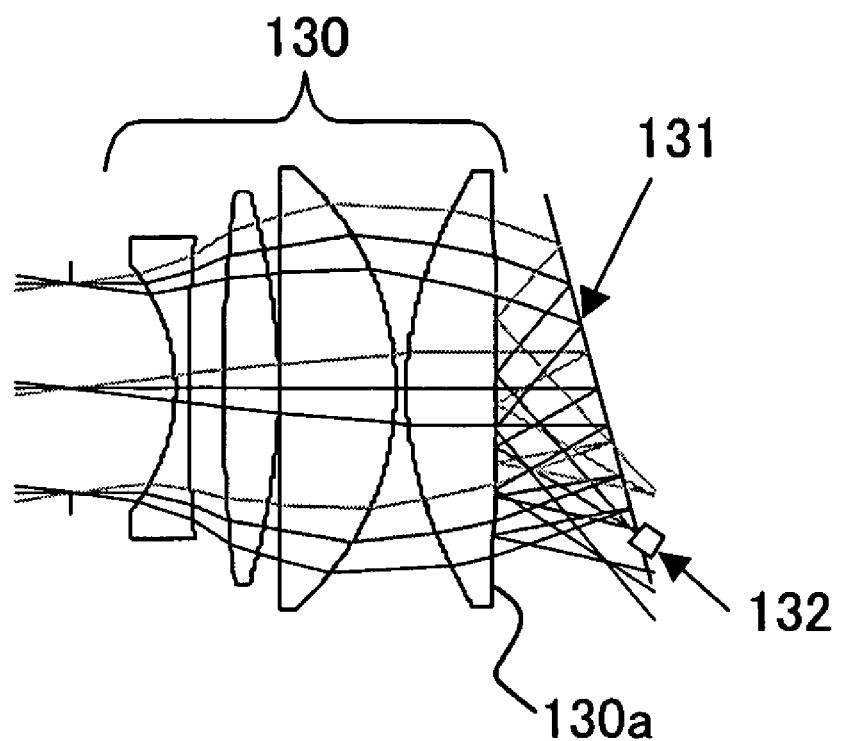
FIG. 4 is an enlarged sectional view showing a positional relationship among a condenser lens, a half mirror, and a sensor in the exposure apparatus shown in FIG. 1.

More specifically, the conventional exposure apparatus reflects the light on the half mirror directly to the sensor as shown in FIG. 3, and inclines the half mirror remarkably to a surface perpendicular to the optical axis in order to arrange the sensor outside the exposure light's optical path. On the other hand, this embodiment reflects the exposure light on the half mirror 131 and then reflects the resultant light on the exit surface 130*a* of the condenser lens 130 or a lens surface closer to the light source unit 110 than the half mirror 131, towards the sensor 132, arranging the half mirror 131 approximately perpendicular to the optical axis. Here, FIG. 3 is an enlarged sectional view showing a positional relationship among the condenser lens, the half mirror and the sensor in the conventional exposure apparatus. FIG. 4 is an enlarged sectional view showing a positional relationship among the condenser lens 130, the half mirror 131 and the sensor 132 in the exposure apparatus 1.

When the light reflected on the half mirror 131 is reflected on the lens surface (or the condenser lens 130's exit surface 130*a*) at the light source unit 110 side, an inclined angle of the half mirror 131 can be reduced. Splitting of the light is facilitated, since both the condensed light upon the sensor 132 and the exposure light from the condenser lens 130 are condensed toward the reticle 200 surface. In addition, the sensor 132 can be arranged closer to the optical axis than the prior art, without shielding the exposure light. This configuration can arrange the half mirror at an inclination angle of about 15° relative to the optical axis, whereas the prior art configuration arranges the half mirror at an inclination angle of about 40° relative to the optical axis. Therefore, the light is incident at inclination angles between −15° and +45° upon the half mirror 131 in this embodiment. Since the light incident at an inclination angle of −15° to the half mirror 131 is equivalent to the light at an inclination angle of +15° to the half mirror 131, the incident angle of the light upon the half mirror 131 ranges between 0° and 45°.

Figure 9:
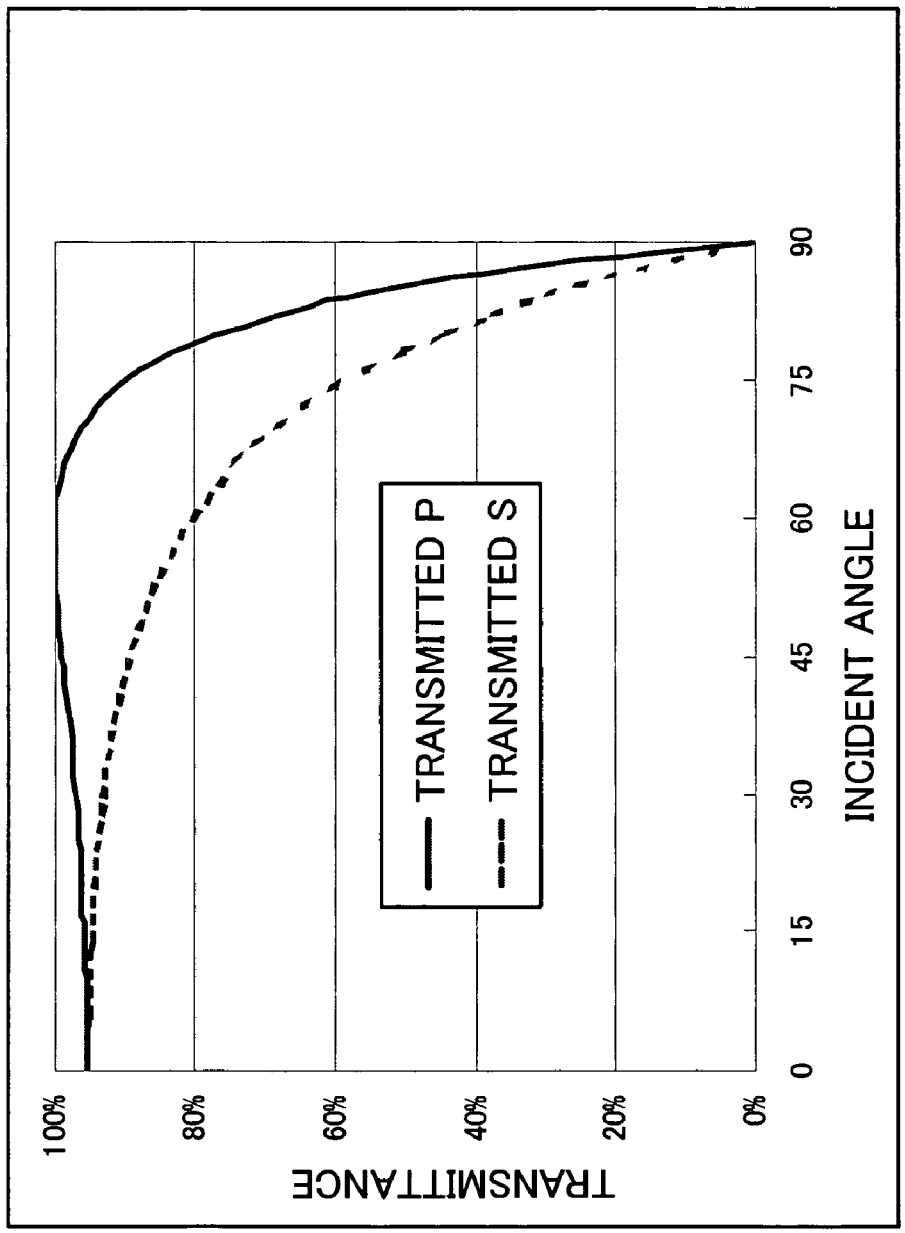
FIG. 9 is a graph showing transmittances of s-polarized and p-polarized lights through a non-coated surface.

Referring to FIG. 9, the transmittance of the light incident at an inclination angle of 0° upon the half mirror 131 is about 95% for both the p-polarized light and the s-polarized light. The transmittance of the light incident at an inclination angle of 45° is about 98% for the p-polarized light and about 89% for the s-polarized light. Therefore, the s-polarized light incident upon the half mirror 131 generates a light intensity difference of about 6% depending upon angles during exposure. Since the prior art causes a light intensity difference of about 27% as discussed above, the present invention remarkably reduces the light intensity difference and greatly improve the resolving power.

While FIG. 9 shows the transmittance on a non-coated surface, use of the coating in accordance with the appropriate coating design can reduce the transmittance difference due to the incident angles. Therefore, use of the half mirror 131 that has a coating with a small transmittance difference is preferable. While this embodiment reflects the light on the exit surface 130*a* of the condenser lens 130 that is closest to the half mirror 131 on the side of the light source unit 110, the light may be reflected on the condenser lens 130 that is closest to the light source unit 110. In other words, the light may be reflected on any lens surface of the condenser lens 130 or plural surfaces and then introduced to the sensor 132. Since the light that is reflected on a surface other than the reflective lens surface and enters the sensor 132 causes noises, the reflective lens surface should have a higher reflectance than other lens surfaces. Usually, the lens surface having an antireflection coating has a reflectance of 0.2% or smaller. The reflective lens surface has a reflectance of 2% or greater, ten times as high as that of other lens surfaces. The reflectance of the non-coated surface that has no anti-reflection coating is about 4%, and the reflective lens surface preferably has no antireflection coating. On the other hand, as the reflectance of the reflective surface reduces, the light intensity of the target surface and the throughput increase, since the reflective surface reflects the exposure light that is expected to reach the target surface or the light incident upon the reflective surface before the light enters the half mirror 131. Therefore, it is preferable that the reflective coating having a reflectance of 2% or greater is formed on the reflective lens surface.

The sensor 132 is an exposure dose sensor that monitors the exposure dose upon the object 400 so as to monitor the exposure dose while the object 400 is being exposed. An illumination photometer 510 is provided on the wafer stage 500, which will be described later, and measures the light intensity on the object 400. Since a relationship between the exposure dose detected by the sensor 132 and the light intensity on the object 400 changes according to the transmittance changes of the projection optical system 300 etc., the illumination photometer 510 is provided on the optical path on a regular basis, the light intensity detected by the illumination photometer 510 is correlated with the exposure dose detected by the sensor 132, and the controller 600 stores the result.

The relay optical system 133 projects a light intensity distribution at the position B onto a pattern surface of the reticle 200.

While this embodiment illustratively forms a random polarization for the light from the light source unit 110 by using the random phase plate 121 and then converts the polarization state to the desired one at the polarized light splitting film 128, the present invention is effective irrespective of the control method of the polarization state. Other control method of the polarization state includes, for example, a method for maintaining the polarization state of the laser emitted from the light source unit 110, and for inserting a λ/2 plate and a λ/4 plate instead of the polarized light splitting film 128, and a method for arranging a polarization controller at a position other than a position just prior to the fly-eye lens 129. The present invention is effective to any method. The present invention is also effective to an illumination optical system that does not provide a polarization illumination, since the incident angle distribution on the target surface becomes more uniform than the conventional.

The illumination optical system 120 can reduce the transmittance difference from the half mirror 131 inserted into the exposure optical path, which transmittance difference is caused by the polarization state of the light. Therefore, the illumination optical system 120 can provide a desired polarization illumination, and realize transferring at a sufficiently high resolution in the exposure apparatus having a high-NA projection optical system.

The mask 200 is made for example, of quartz, and has a circuit pattern (or an image) to be transferred. It is supported and driven by the reticle stage (not shown). The diffracted light from the reticle 200 passes the projection optical system 300, and then is projected onto the object 400. The reticle 200 and the object 400 are located in an optically conjugate relationship. Since the exposure apparatus 1 of the instant embodiment is a scanner, the reticle 200 and the object 400 are scanned at a speed ratio of the reduction ratio. Thus, the pattern of the reticle 200 is transferred to the object 400. If it is a step-and-repeat exposure apparatus (referred to as a "stepper"), the reticle 200 and the object 400 remain still in exposing the mask pattern.

The projection optical system 300 projects the light that reflects a pattern of the reticle 200 onto the object 400, and has a NA of 0.9 or higher. The projection optical system 300 projects a circuit pattern of the reticle 200 onto the object 400 at a reduction ratio of 1/4. The projection optical system 300 may use a (dioptric) optical system solely including a plurality of lens elements, a (catadioptric) optical system including a plurality of lens elements and at least one mirror, an optical system including a plurality of lens elements and at least one diffraction optical element such as a kinoform, and a (catoptric) optical system of a full mirror type, and so on. Any necessary correction of the chromatic aberrations may use a plurality of lens units made from glass materials having different dispersion values (Abbe values) or can arrange diffraction optics such that it disperses in a direction opposite to that of the lens unit. The projection optical system 300 may be an immersion type projection optical system that immerses a space between its final lens at the object 400 side and the object 400 with water and highly refractive index solution, or an optical system having a NA of 1.0 or higher, such as a solid immersion type projection optical system.

The object 400 is a wafer in this embodiment, but may broadly covers a LCD and another object to be exposed. A photoresist is applied to the object 400.

The wafer stage 500 supports the object 400. The wafer stage 500 may use any structures known in the art, and a detailed description of its structure and operation is omitted. The wafer stage 500 may use, for example, a linear motor to move the object 400 in the XYZ directions. The reticle 200 and object 400 are, for example, scanned synchronously. The positions of the wafer stage 500 and reticle stage (not shown) are monitored, for example, by a laser interferometer so that both are driven at a constant speed ratio. The wafer stage 500 is provided, for example, on a stage stool that is supported on a floor etc. via dampers, and the reticle stage and the projection optical system 300 are placed, for example, on a barrel stool (not shown) that is supported on a base frame that is provided on the floor etc. via dampers. A scanning direction on a plane that includes the reticle 200 or the object 400 is defined as x, a direction perpendicular to the x direction is defined as y, and a direction perpendicular to the plane of the reticle 200 or the object 400 is defined as z.

The controller 600 has a CPU and a memory (not shown), and controls operations of the exposure apparatus 1. The controller 600 is electrically connected to the illumination apparatus 100, the reticle stage (not shown), and the wafer stage 500. The CPU includes a processor irrespective of its name, and controls operation of each component. The memory includes a ROM and a RAM, and stores the firmware to operate the exposure apparatus 1. The controller 600 in this embodiment calculates the exposure dose onto the object 400 surface based on a relationship between the exposure dose and the light intensity input from the sensor 132 and the illumination photometer 510, and controls the exposure dose based on the calculation result.

In exposure, the light emitted from the light source unit 110, for example, Koehler-illuminates the reticle 200 via the illumination optical system 120. The light that passes the reticle 200 and reflects the reticle pattern is imaged onto the object 400 by the projection optical system 300. The illumination optical system 120 reduces a transmittance difference caused by the polarization state of the half mirror 131, and forms the effective light source shape and the polarization state suitable for the reticle pattern, providing a high-quality exposure to the object 400 with desired resolution. The high-NA projection optical system with a desired polarization state of the light can provide devices, such as a semiconductor device, a LCD device, an image-pickup device (such as a CCD), and a thin film magnetic head, at a high throughput and economical efficiency.

Figure 5:
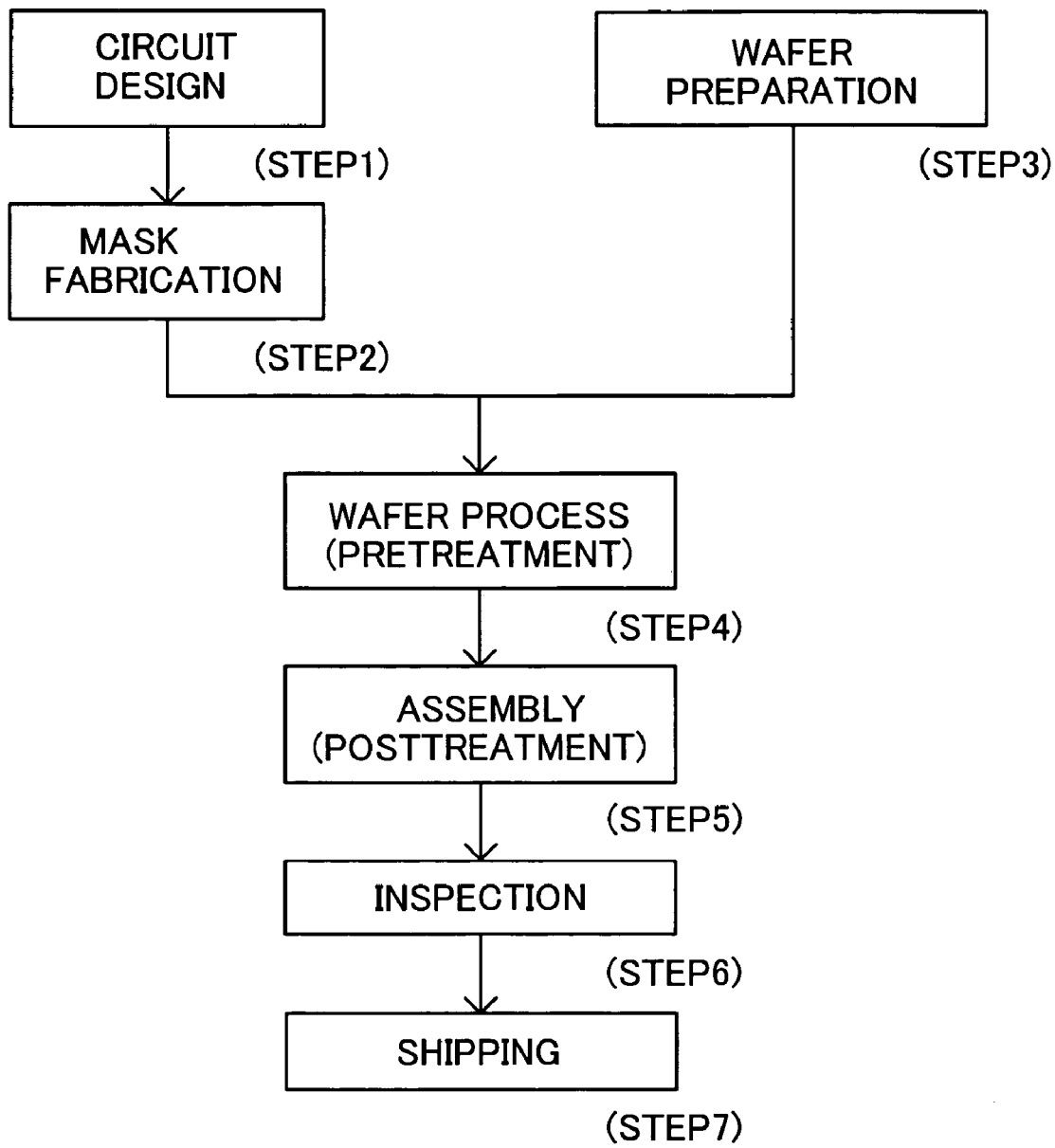
FIG. 5 is a flowchart for explaining a method for fabricating devices (semiconductor chips such as ICs, LSIs, and the like, LCDs, CCDs, etc.).
Figure 6:
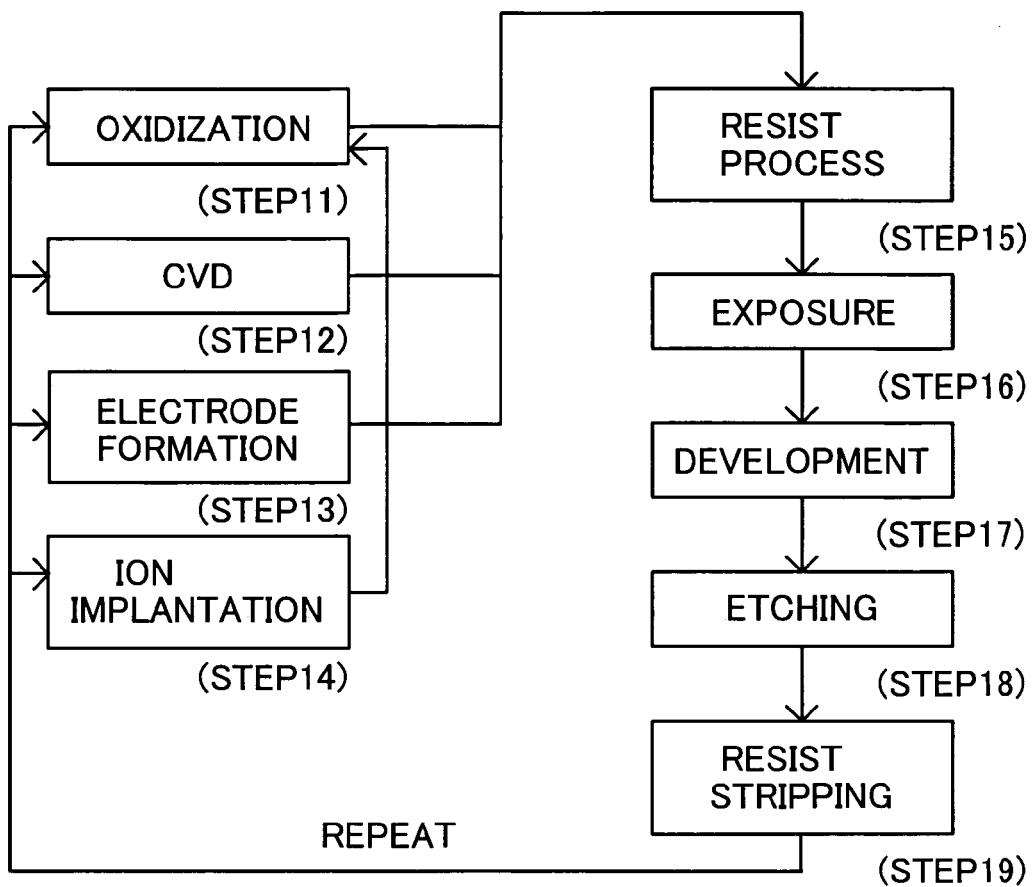
FIG. 6 is a detailed flowchart for Step 4 of wafer process shown in FIG. 5.
Figure 7:
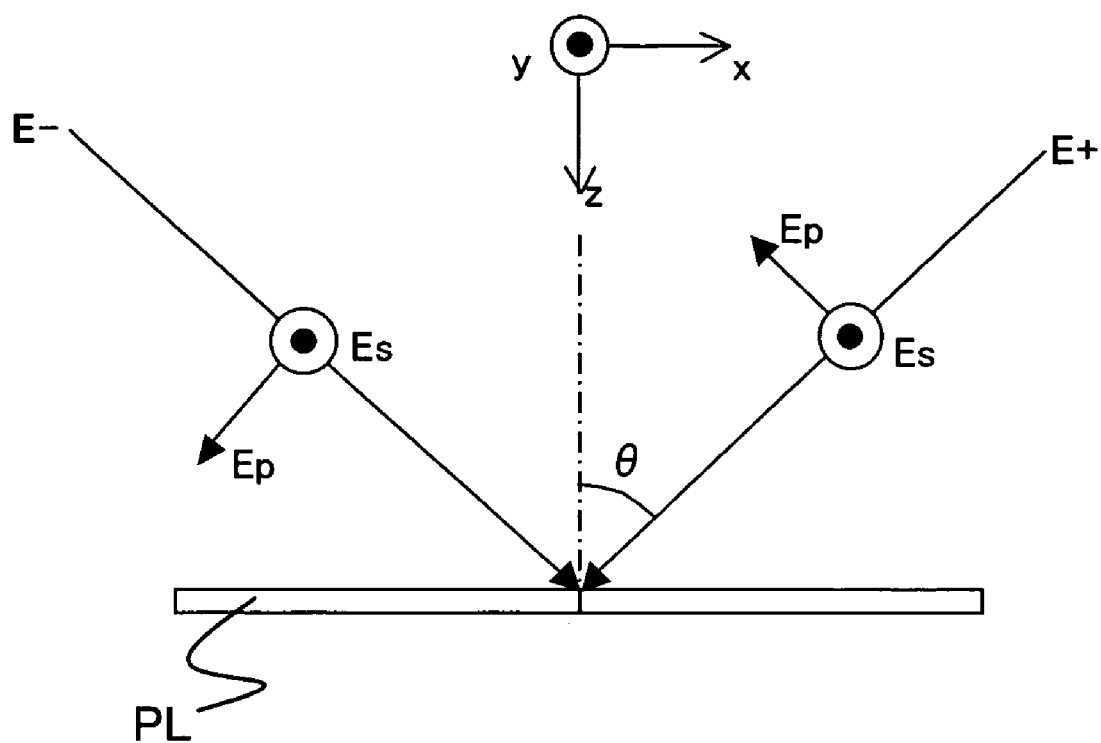
FIG. 7 is a view for explaining that the contrast of the interference fringe (image) reduces in a high-NA projection optical system.
Figure 8:
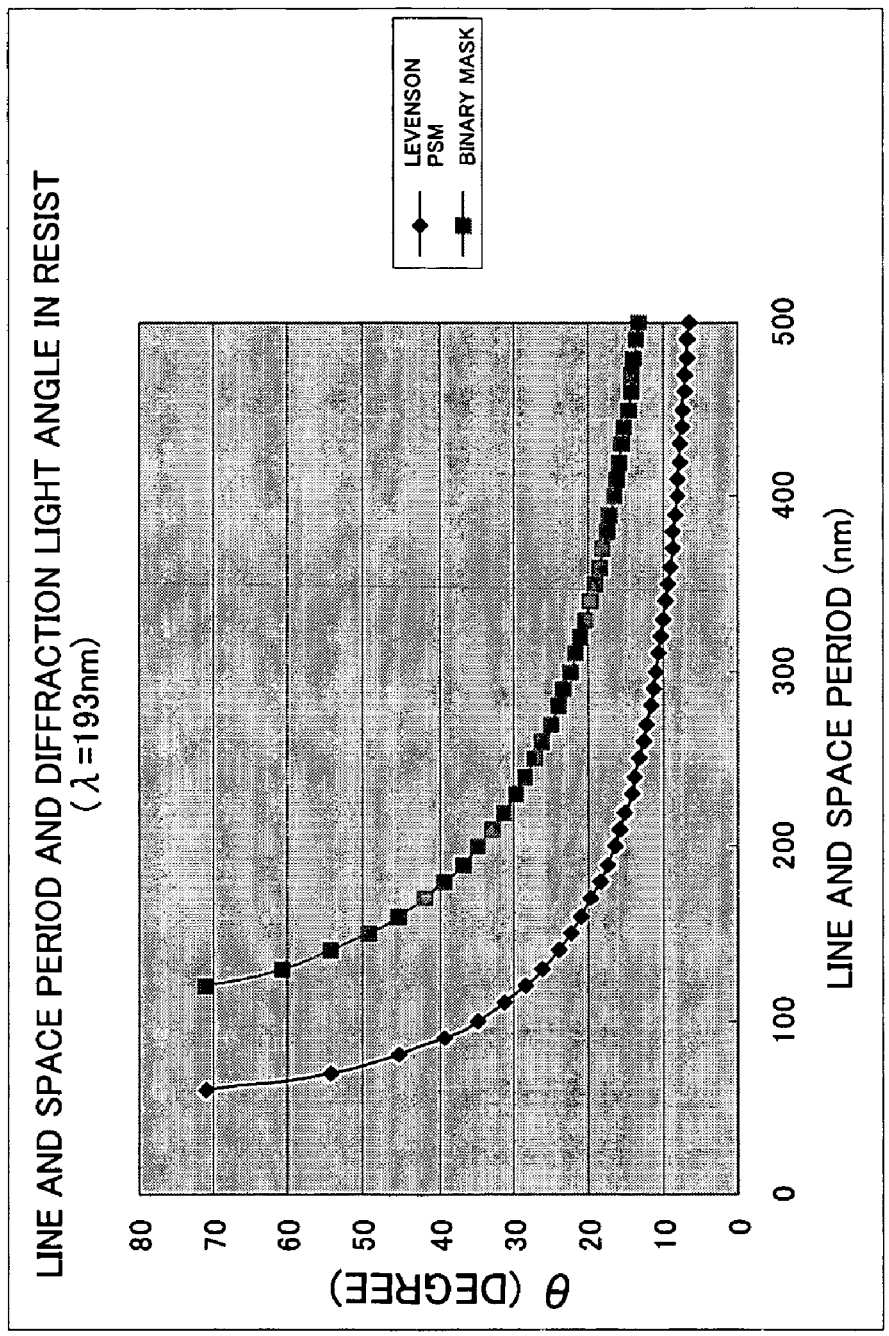
FIG. 8 is a graph showing an angle θ between diffracted lights in a resist when a line and space is projected with a wavelength of an ArF excimer laser.

Referring now to FIGS. 5 and 6, a description will now be given of an embodiment of a device manufacturing method using the above exposure apparatus 1. FIG. 5 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 6 is a detailed flowchart of the wafer process in Step 4 shown in FIG. 5. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 1 to expose a reticle pattern onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. This embodiment can provide higher-quality semiconductor devices than the prior art. Thus, the device manufacturing method that uses the exposure apparatus 1, and its resultant (intermediate and final) products also constitute one aspect of the present invention.

Thus, the inventive illumination optical system can provide an illumination at a predetermined polarization state by reducing a transmittance difference caused by an angle and polarization state of the light incident upon the half mirror that is arranged on the optical path.

Furthermore, the present invention is not limited to these preferred embodiments and various variations and modifications may be made without departing from the scope of the present invention.

This application claims a foreign priority benefit based on Japanese Patent Applications No. 2004-110338, filed on Apr. 2, 2004, which is hereby incorporated by reference herein in its entirety as if fully set forth herein.

What is claimed is:

1. An illumination optical system for illuminating a target surface using light from a light source, said illumination optical system comprising:
    a light splitter for splitting part of the light;
    an optical element, arranged between the light source and said light splitter, for transmitting the light and for reflecting the part of the light that has been split by said light splitter; and
    a sensor for detecting a light intensity of the light reflected by the optical element.

2. An illumination optical system according to claim 1, wherein said sensor is arranged substantially conjugate with the target surface.

3. An illumination optical system according to claim 1, wherein said light splitter is inclined to an optical axis at an angle between 10° and 30°.

4. An illumination optical system according to claim 1, further comprising a polarization controller for controlling a polarization state of the light on the target surface to a predetermined polarization on the target surface.

5. An illumination optical system according to claim 4, further comprising an effective light source generating means for determining a shape of the effective light source on a pupil surface,
    wherein the predetermined polarization has polarization directions that are aligned with a predetermined direction on the effective light source.

6. An illumination optical system according to claim 4, further comprising an effective light source generating means for determining an annular shape of the effective light source on a pupil surface,
    wherein the predetermined polarization has radial polarization directions on the annular shape.

7. An illumination optical system according to claim 1 wherein said light splitter reflects the part of the light.

8. An illumination optical system for illuminating a target surface using light from a light source, said illumination optical system comprising:
    a light splitter for splitting part of the light; and
    an optical element arranged between the light source and the light splitter, said optical element having a reflective surface that has a reflectance of 2% or higher and reflects the part of the light that has been split by said light splitter and;
    a sensor for detecting a light intensity of the light reflected by the optical element.

9. An illumination optical system according to claim 8, wherein the light splitter is inclined to an optical axis at an angle between 10° and 30°.

10. An illumination optical system according to claim 8, further comprising a polarization controller for controlling a polarization state of the light on the target surface to a predetermined polarization on the target surface.

11. An illumination optical system according to claim 10, further comprising an effective light source generating means for determining a shape of the effective light source on a pupil surface,
    wherein the predetermined polarization has polarization directions that are aligned with a predetermined direction on the effective light source.

12. An illumination optical system according to claim 10, further comprising an effective light source generating means for determining an annular shape of the effective light source on a pupil surface,
    wherein the predetermined polarization has radial polarization directions on the annular shape.

13. An illumination optical system according to claim 8, wherein said light splitter reflects part of the light.

14. An exposure apparatus comprising:
    an illumination optical system according to claim 1 for illuminating a reticle; and
    a projection optical system for projecting light that has transmitted the reticle onto an object.

15. An exposure apparatus according to claim 14, wherein said projection optical system has a numerical aperture of 0.9 or higher.

16. An exposure apparatus comprising:
   an illumination optical system according to claim 8 for illuminating a reticle; and
   a projection optical system for projecting light that has transmitted the reticle onto an object.

17. An exposure apparatus according to claim 16, wherein said projection optical system has a numerical aperture of 0.9 or higher.

18. An exposure apparatus comprising:
   a projection optical system for projecting light from a light source that passes a pattern onto an object to be exposed;
   a light splitter arranged between the light source and the pattern, said light splitter splitting part of the light that reaches the object;
   an optical element arranged between the light source and the light splitter, said optical element reflecting part of the light that has been split by said light splitter, towards said sensor; and
   a sensor for detecting the light split by the light splitter and reflected by the optical element, and for monitoring an exposure dose on the object.

19. An exposure apparatus according to claim 18, wherein said optical element has a reflectance of 2% or higher on a reflective surface that reflect the part of the light.

20. A device manufacturing method comprising the steps of:
   exposing an object using an exposure apparatus according to claim 14; and
   developing the object that has been exposed.

21. A device manufacturing method comprising the steps of:
   exposing an object using an exposure apparatus according to claim 16; and
   developing the object that has been exposed.

22. A device manufacturing method comprising the steps of:
   exposing an object using an exposure apparatus according to claim 18; and
   developing the object that has been exposed.

* * * * *